United States Patent [19]

de Brebisson

[11] 4,443,933
[45] Apr. 24, 1984

[54] UTILIZING MULTI-LAYER MASK TO DEFINE ISOLATION AND DEVICE ZONES IN A SEMICONDUCTOR SUBSTRATE

[75] Inventor: Michel X. M. de Brebisson, Caen, France

[73] Assignee: U.S. Philips Corporation, New York, N.Y.

[21] Appl. No.: 367,506

[22] Filed: Apr. 12, 1982

Related U.S. Application Data

[63] Continuation of Ser. No. 169,573, Jul. 17, 1980, abandoned, which is a continuation of Ser. No. 22,574, Mar. 21, 1979, abandoned, which is a continuation of Ser. No. 812,261, Jul. 1, 1977, abandoned.

[30] Foreign Application Priority Data

Jul. 15, 1976 [FR] France .............................. 76 21646

[51] Int. Cl.³ .................... H01L 21/26; H01L 21/308
[52] U.S. Cl. .................................... 29/578; 29/576 B; 29/576 W; 29/580; 148/1.5; 148/187; 156/648; 156/653; 156/657; 156/661.1; 156/667
[58] Field of Search .............. 156/644, 647, 648, 653, 156/657, 667, 661.1; 357/48; 148/1.5, 187; 29/576 B, 576 W, 578, 580

[56] References Cited

U.S. PATENT DOCUMENTS

| | | | |
|---|---|---|---|
| 3,488,564 | 1/1970 | Crafts | 357/48 |
| 3,576,630 | 4/1971 | Yanayawa | 156/657 |
| 3,591,840 | 7/1971 | Glinski | 357/48 |
| 3,708,360 | 1/1973 | Wakefield | 156/653 |
| 3,748,187 | 7/1973 | Aubuchon et al. | 148/1.5 |
| 3,773,566 | 11/1973 | Tsuchimoto | 148/1.5 |
| 3,860,466 | 1/1975 | Workman et al. | 148/187 |
| 3,899,363 | 8/1975 | Dennard et al. | 148/1.5 |
| 3,948,694 | 4/1976 | Mills | 148/187 |
| 4,135,954 | 1/1979 | Chang et al. | 29/576 W |

Primary Examiner—Jerome W. Massie
Attorney, Agent, or Firm—Thomas A. Briody; Robert T. Mayer; Steven R. Biren

[57] ABSTRACT

A method is disclosed for the self-aligned manufacture of a semiconductor device having island insulation obtained by thermal oxidation. An insulating layer (preferably of silicon oxide), a layer of silicon nitride, and a layer preferably of aluminum oxide are provided successively on the semiconductor surface. In the last-mentioned layer a basic mask is formed having apertures at the area of all the semiconductor zones to be formed and at the area of the island insulation zones. From this mask the various processes are carried out via a replica mask obtained in the nitride layer.

4 Claims, 25 Drawing Figures

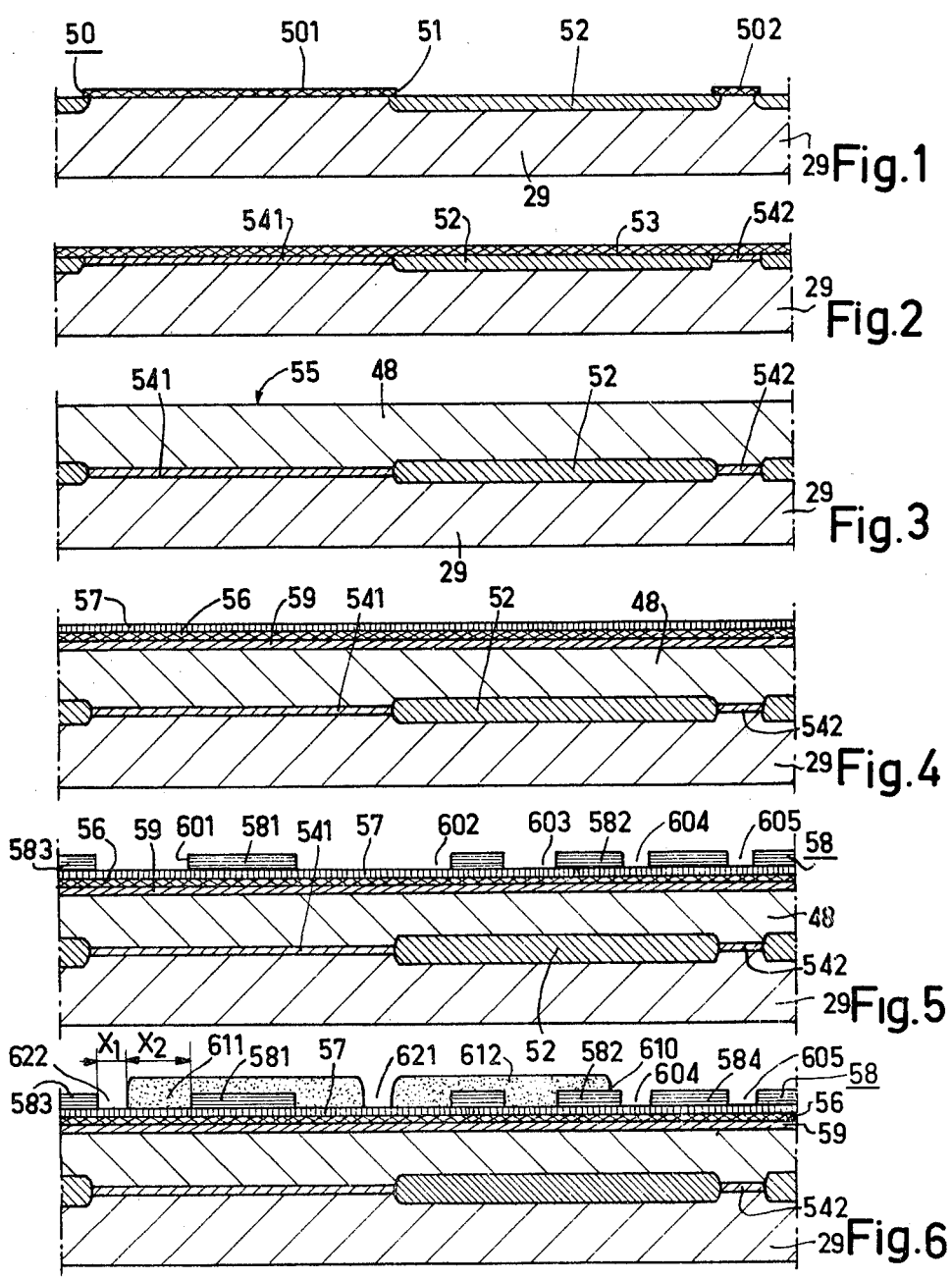

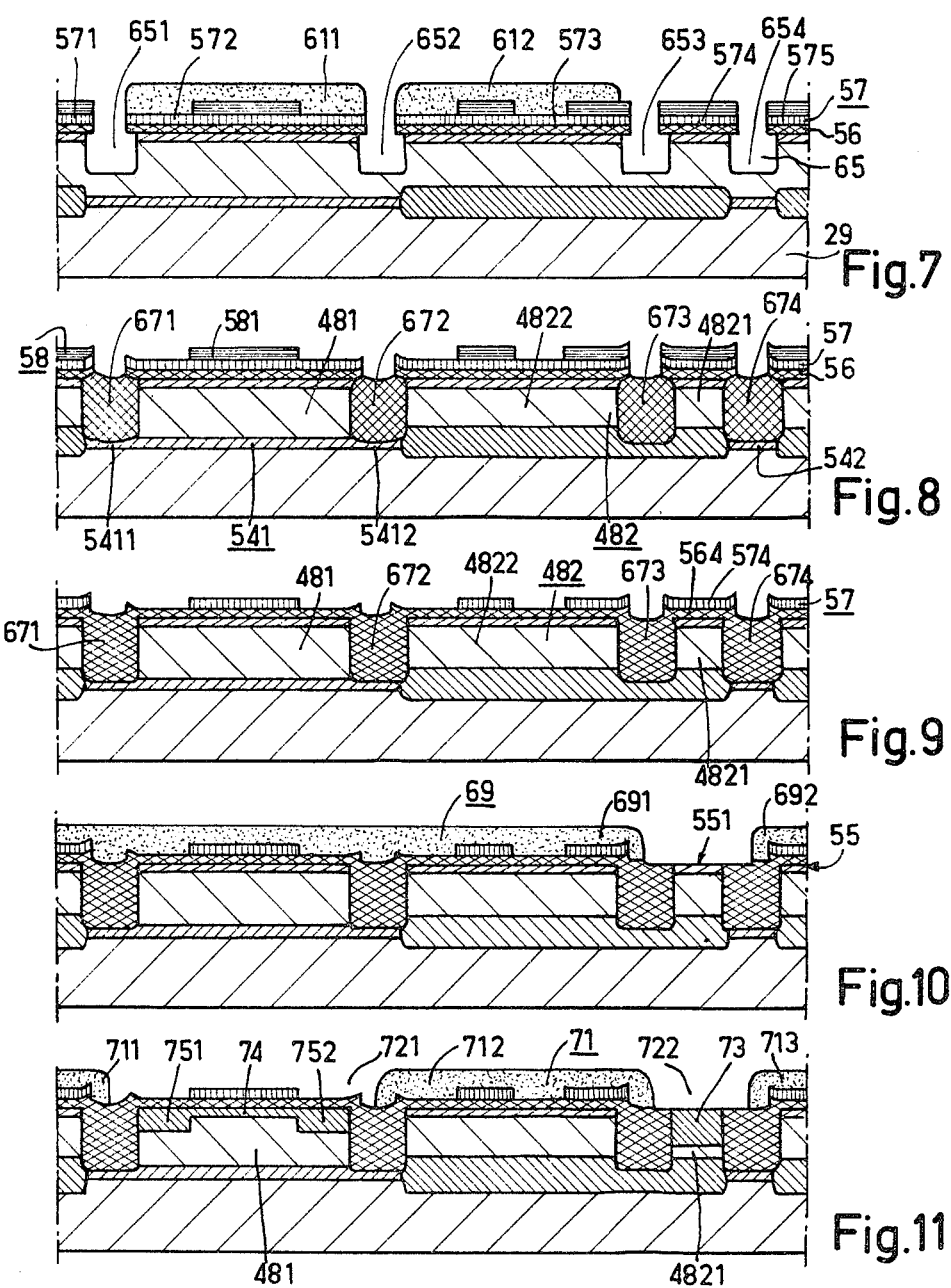

UTILIZING MULTI-LAYER MASK TO DEFINE ISOLATION AND DEVICE ZONES IN A SEMICONDUCTOR SUBSTRATE

This is a continuation of application Ser. No. 169,573, filed July 17, 1980, now abandoned, which is a continuation of application Ser. No. 22,574, filed Mar. 21, 1979, now abandoned, which is a continuation of application Ser. No. 812,261, filed July 1, 1977, now abandoned.

BACKGROUND OF THE INVENTION

The invention relates to a method of manufacturing a semiconductor device in which a first insulating layer is provided on the surface of a semiconductor body, on which layer a second insulating layer of a different material is provided, in which second insulating layer apertures are provided at the area of all the surface-adjoining zones of the device to be provided, of which at least a part of at least a first aperture is left uncovered and the remaining apertures are covered by a covering layer, after which within the uncovered region the first insulating layer is removed after which the covering layer is removed and within the resulting first aperture in the first insulating layer a process is carried out to obtain a first surface zone of the device, and the first insulating layer within at least a part of at least a second aperture of the second insulating layer is then removed and in the resulting second aperture in the first insulating layer an operation is carried out to obtain a semiconductor zone belonging to a semiconductor circuit element.

Such a method is known from the published French Patent application No. 2130397, which corresponds to U.S. Pat. No. 3,783,047, FIG. 12.

The invention also relates to a semiconductor device obtained according to the said method.

Semiconductor devices with integrated circuits are formed by performing a number of operations, for example, epitaxial growth, diffusions, ion implantations, etching processes, etc. The greater part of said operations should be carried out locally by means of a number of masking steps. However, the possibility of an accumulation of errors in positioning the successively used masks gives rise to great tolerances and to an increase of the dimensions of the elements and of their mutual distances.

In addition, the ever increasing complexity of the integrated circuits results in an ever increasing number of masking steps which in turn result in an accumulation of superimposed layers, which reduces the precision of the etching processes. The level differences formed in this manner may in addition cause fracture of the metallization.

Furthermore, the tendency of using ever higher frequencies leads to reduction of dimensions and hence requires an ever increasing precision.

On the basis of the above it is desirable to perform a maximum number of treatments starting from the same mask, the basic mask, a feature which will hereinafter be referred to by the term "self-aligned provision".

In applicant's published French Patent application No. 2,282,162 there is described a method for the self-aligned provision in an integrated circuit of the emitter zones, the base contact zones and the collector contact zones of the transistors and also of the zones between the islands obtained by diffusion starting from a basic mask obtained via a single photoetching process.

For each treatment, the windows of the mask not used for said treatment are covered. However, this method cannot be used when the lateral island isolation is obtained by means of insulating zones which are realized by recessing and oxidation of the semiconductor material. There is no photolacquer which can withstand thermal oxidation even when this takes place at lower temperature.

SUMMARY OF THE INVENTION

One of the objects of the invention is to provide a method for the self-aligned provision of at least all the elements of which the position and/or the dimensions directly influence the characteristics of the device, which elements should hence be realized very accurately, including the insulation zones formed by thermal oxidation.

It should be noted that the above expression "Insulating zones" does not involve any restriction as regards the shape and the dimensions of the relevant insulating parts. The said zones may even occupy the whole surface of the disk with the exception of the surface occupied by the active and passive elements.

The invention is inter alia based on the recognition of the fact that the end in view can be reached by using a suitable combination of three insulating layers to form successive masks starting from the same basic mask.

According to the invention a method of the kind described above is characterized in that the first insulating layer is provided on a third insulating layer of a material other than the first insulating layer and provided directly on the semiconductor surface, that the first insulating layer consists of silicon nitride, and that within the first aperture in the first insulating layer the third insulating layer is removed, after which the uncovered semiconductor material present within the said first aperture is oxidized thermally to form an insulation zone surrounding a semiconductor island in which the said semiconductor circuit element is provided.

During the formation of the insulating zones, the lowermost insulating layer serves as a mask and in the ultimately obtained structure it serves as a passivating layer.

The apertures which are provided in the basic mask at the area of the various zones permit the correct definition of the said zones via the apertures in a replica mask manufactured therefrom in an underlying layer. In this manner the positions and the dimensions of the semiconductor zones are fully defined with respect to the insulating zones.

The method according to the invention permits mutually insulating two juxtaposed semiconductor zones by means of an intermediate oxide zone, the distance between the semiconductor zones being smaller than when using semiconductor island insulation zones, the minimum distance being determined by the breakdown voltage of a p-n junction.

In addition it is known that the first photo-etching which should be carried out in manufacturing integrated circuits is always easy and can in particular be carried out in a very precise manner due to the fact that said photoetching is carried out on a flat surface. As regards the method according to the invention, this advantage is used for all the windows which during the formation of the basic mask are provided simultaneously in a uniform layer. As a result of this the window positions and dimensions are more precise than when several masks are provided successively on the same surface.

A preferred embodiment of the method according to the invention is characterized in that in a first operation the first insulating layer is removed only in a part of the first aperture in the second insulating layer and that after the thermal oxidation the first insulating layer is removed also within the remaining part of the first aperture in the second insulating layer and a doped semiconductor zone adjoining the insulating zone is formed via said remaining part.

Adjoining an insulating zone whose dimensions do not require great precision it is possible in this manner to provide any region whose dimensions, at least on the side of the insulating zone, are also less important than the dimensions of other regions, for example, the resistance contact regions or the base contact regions.

According to a preferred embodiment of the method according to the invention, at least a semiconductor zone is formed by ion implantation through the third layer as a result of which it is possible to obtain correct doping concentrations and zones of a small thickness. As a mater of fact, ion implantation enables the use of conventional photolacquer as a mask. Due to the fact that in addition ion implantation does not take place at high temperature, undesired lateral diffusion is avoided. It is of advantage when all the necessary diffusions are realized during the same thermal treatment which is carried out after providing all the dopants.

When silicon is used as a semiconductor material, the insulating zones are preferably realized by recessing and oxidation at low temperatures. The recessing occurs via apertures which are provided in the insulating layer, and by means of a suitable etchant; the surface of the grooves obtained in this manner is subjected to an oxidation. It is known that in particular the oxidation of silicon can be carried out at low temperatures at a high water vapor or oxygen pressure.

The choice of the materials which are used for the various insulating masking layers depends on several criteria.

It should be possible to selectively etch the material of the basic mask by an etchant which is not active or at most is only very slightly active with respect to the underlying layer; it should be possible to form or deposit said material in a small thickness and in addition to etch it with precision; in addition said material should be insensitive to the etchants which are used to remove the other materials and should also be impervious or at most only slightly pervious to the dopants used for the formation of the semiconductor zones.

In connection with the above, the second insulating layer preferably consists of aluminum oxide, while the third insulating layer preferably is silicon oxide.

The third layer provided directly on the semiconductor surface may fulfil several functions: facilitating the formation of the silicon nitride layer, or the improvement of the quality thereof, and the displacement towards the semiconductor surface of the maximum concentration of implanted doping ions, which occurs via implantation through the said third layer.

BRIEF DESCRIPTION OF THE DRAWING

The invention will now be described in greater detail with reference to the drawing, in which:

FIGS. 1 to 16 are partly diagrammatic cross-sectional views of various stages in the manufacture of a disk having an integrated semiconductor circuit comprising at least a bipolar transistor and a resistor.

Figure 12:
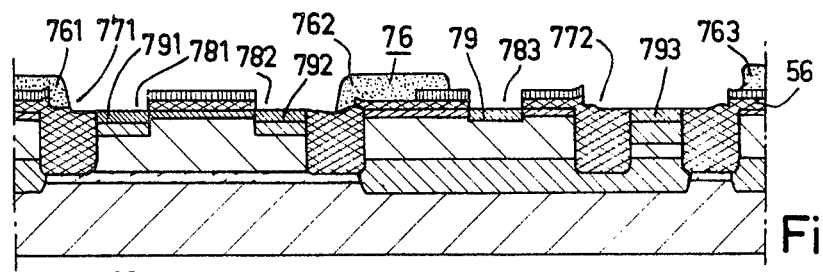

It is to be noted that in the figures the dimensions are not drawn to scale; in particular the thicknesses of the various layers, for example the thickness of the zones obtained by implantation, are exaggerated so as to clarify the figures.

DETAILED DESCRIPTION

The method according to the invention applied to a silicon device comprising a bipolar transistor and a low-value resistor will now be described with reference to FIGS. 1 to 16.

FIG. 1 shows a weakly doped p-type silicon substrate 29. A layer 50 of silicon oxide is formed on the surface of said substrate, for example by thermal oxidation, from which layer the oxide regions 501, 502 are formed by photoetching by etching at least one window 51. Via said window, a region 52 is doped with arsenic or antimony, preferably with antimony, after which a diffusion takes place in which the ultimate concentration in the zone 52 is, for example $10^{21}$ arsenic atoms/$cm^3$ or $5.10^{19}$ antimony atoms/$cm^3$. The resulting disk is shown in FIG. 1.

The oxide mask 50 is then removed by etching, after which on the thus exposed surface an oxide layer 53 is provided whose thickness is approximately 200Å; said layer 53 is obtained by thermal oxidation at 1000° C. for 10 minutes in a dry oxygen atmosphere.

Through the layer 53 an ion implantation is carried out over the whole surface of the disk with an ion dose of $10^{12}$ to $10^{15}$ boron ion per $cm^2$ and an ion energy of 120 to 180 KeV. As a result of the concentration ratio the doping of the strongly doped n-type zones 52 is not reversed but separated by implanted p-type regions 541, 542 which, after an annealing treatment for 15 to 30 minutes at 900° C., for example, have a maximum concentration of $10^{16}$ to $10^{17}$ atoms/$cm^3$. The resulting disk is shown in FIG. 2.

The next phase is the removal of the oxide layer 53, for example, by etching said layer in an etching bath on the basis of hydrofluoric acid and ammonium fluoride. The surface exposed in this manner is now prepared for an epitaxial growth process; in the present example an n-type layer 48 is thus provided epitaxially from the gaseous phase. Said layer 48 is doped, for example, with arsenic in a concentration of $5.10^{14}$ to $10^{16}$ arsenic atoms/$cm^3$ so that the layer obtains a resistance of 0.5 to 2 Ohm.cm. The resulting disk is shown in FIG. 3.

By the use of low temperatures for the formation of insulating zones it is possible to restrict the thermal treatment of the disk; as a result of this, in the epitaxial layer the thickness growth of the region 52 which is to form a buried layer takes place mainly during the epitaxial growth; the thickness of the resulting region 52 is approximately 0.25 to 0.40μm. As a result of this it is possible to restrict the thickness of the epitaxial layer to 1.3 μm and even to 0.8 μm, while afterwards in the process during the formation of the insulating zones by oxidation of the silicon, the develeling at the edge of said zones is only moderate: namely 0.4 μm instead of 0.8 82 m as is the case in normal, longer oxidation times.

The layer 52 is divided into regions which are separated from each other in the plane of the drawing by p-type regions 541, 542. Said regions 541, 542 serve to avoid an inversion layer below the insulating zones to be formed.

The layer 52 is to form a collector current path which leads collector current to the collector connection region and to the collector zone contact of a bipolar transistor. The place occupied by the region 541 corresponds to the place of a resistor having a low ohmic value Rf of which will be formed simultaneously with the collector connection region.

According to the invention, a layer 56 of silicon oxide, hereinbefore referred to as "third insulating layer" is formed on the surface 55 of the epitaxial layer 48 by oxidation and has a thickness of 0.01 $\mu$m to 0.04 $\mu$m.

A boron implantation over the whole surface of the disk is now carried out with an ion energy of 30 KeV to 60 KeV so that the implanted zone 59 is obtained which has a surface concentration of $10^{13}$ to $10^{14}$ boron atoms/cm$^2$. This zone 59 is destined in particular to form the extrinsic part of the base zones of bipolar transistors and possibly to form resistors having an average value of approximately 600 Ohms per square.

By means of a known method which permits a comparatively low temperature, for example in a plasma, the first insulating layer 57 according to the invention is provided on the said oxide layer 56, in which layer 57 the basic mask is to be realized, in which the layer 57 is, for example, of silicon nitride and has a thickness which is compatible both with the photoetching conditions and is sufficient to mask against the various ion implantations, in so far as this is necessary. The nitride which forms the said layer 57 advantageously has a thickness of 0.07 $\mu$m to 0.15 $\mu$m. The disk in this stage of the manufacture is shown in FIG. 4.

By means of known methods, for example cathode sputtering, the second insulating layer 58 of aluminum oxide (Al$_2$O$_3$) is provided on the said first layer 57, which layer 58 has a thickness of 0.1 $\mu$m to 0.4 $\mu$m and in which the basic mask is to be formed.

The second insulating layer 58 is then etched by photoetching so as to obtain apertures 601 to 605 to realize the basic mask in this manner. Said etching treatment is preferably carried out by means of an etching bath containing 10 to 30 g of ammonium fluoride per liter of glacial acetic acid. Etching is discontinued automatically at the layer 57 of silicon nitride without attacking same. The resulting structure is shown in FIG. 5.

The edges of the basic mask can be realized with a precision of ±0.25 $\mu$m, so that is is possible to efficaciously provide ultimately in the third insulating layer apertures of approximately 1 $\mu$m which are separated from each other by regions whose width is at least 2 $\mu$m.

The aperture 603 corresponds to the place where afterwards the emitter zone and the intrinsic part of the base zone of the transistor are to be provided successively. The apertures 604 and 605 correspond to the places occupied by the insulating zones.

The apertures 601 and 602 each comprise at least two adjoining regions in which at least one of the said regions will be formed by an insulating zone, while the other region will be formed by a semiconductor contact region.

The insulating zones to be formed ensure the insulation between the remainder of the integrated circuit and an island-shaped region in which a semiconductor circuit element (transistor, resistor and so on) is formed. The insulating zone to be formed within the aperture 604 ensures the insulation between the collector connection region of the transistor and the remainder of the transistor, the region 52 serving as a conductor between the said collector connection region and the collector zone itself. In order to arrange the collector connection region and the base zone of the transistor closer together and to realize in this manner a gain in area, the last-mentioned insulating zone may be narrower than the other insulating zones and the said zone has, for example, a minimum thickness of 4 $\mu$m instead of 5 $\mu$m, which corresponds to an aperture of 2 $\mu$m to 2.5 $\mu$m instead of an aperture of 3 $\mu$m to 3.5 $\mu$m and that taking into account the under-etching and the depth of oxidation.

The disk obtained in this stage is shown in FIG. 5. A layer of photosensitive lacquer is then provided on said disk of which layer, by photopolymerization in the plane of the figure, the photolacquer regions 611 and 612 which are separated from each other by an aperture 621 are maintained after a developing process. The resulting disk is shown in FIG. 6.

The precision with which the position of said photolacquer mask is fixed with respect to the basic mask is ±1 $\mu$m.

It is to be noted that as a result of the fact of the method which will be used for the selective etching treatment of the silicon nitride without attacking the silicon oxide, the positions of the photolacquer regions 611, 612 are not yet fixed with great precision. This is indicated especially in FIG. 6 by the shrinkage of one end 610 of the photolacquer 612 with respect to the edge of the underlying region 582 of the layer 58.

On the contrary, the other end of the photolacquer region 612 forms the boundary of the place occupied by an insulating zone, the covered adjacent surface being occupied by the base zone contact; as is also the case for the two other ends of the photolacquer region 611, the places which are situated beside the region 581 of the layer 58 are the contact regions of the resistor to be realized.

When, viewed in the plane of the figure, X1 is the width of the aperture 622 between the edge of the region 583 of the layer 58 and the adjacent edge of the photolacquer region 611, the edge of the region 611 at the same time determines both the width X1 and the width X2 of the resistance contact.

Due to the position of the edges of the photolacquer regions 611, 612, both the position and the dimensions of the base contact region of the transistor and those of the other contact region of the resistor are determined on either side of the aperture 621. All the dimensions of regions which require a great precision, that is to say the width of the base zone, the width of the emitter zone, the resistor length and the distance between the collector connection region and the base zone which may be referred to as dimensionally critical regions, are determined by the basic mask formed by the layer 58.

By etching by means of orthophosphoric acid or in a plasma on the basis of fluorides and oxygen, the silicon nitride parts of the layer 57 situated within the apertures 604, 605, 621 and 622 are removed. Etching is discontinued automatically by the silicon oxide layer 56.

In this manner apertures are provided in the silicon nitride layer 57 which, in the plane of the drawing, separate the regions 571, 572, 573, 574, 575 from each other.

The silicon oxide layer 56 is etched by means of a solution containing hydrofluoric acid and ammonium fluoride, and apertures are formed in the said layer 56 which are a true copy of the apertures formed in the replica mask layer 57.

By means of a known solution containing hydrofluoric acid, nitric acid, acetic acid and iodine, grooves 651 to 654 are etched, see FIG. 7. Since for filling the said grooves an oxidation is used, the depth of said grooves is slightly larger than half and smaller than two thirds of the thickness which the insulating zone is to have. The said etching process gives rise to an underetching which is shown in FIG. 7.

If in the case under consideration the channel stopping regions would not be formed by an implantation on the substrate, said regions could be formed in this stage of the manufacture by an implantation of a small dose of boron ions. These ions are stopped by the various layers provided on the disk, except at the area of the grooves 651 to 654 where the said ions form the channel stopping regions.

The remaining parts of the photolacquer layer 611, 612 are then removed in the usual manner. The disk obtained in this stage is shown in FIG. 7.

The grooves 651 to 654 are then filled by oxidtion under pressure and at low temperature. The said oxidation is carried out, for example, in an atmosphere of saturated water vapor at a pressure of 60 atmospheres at 800° C. to 90 atmospheres at 650° C., or in a pure oxygen atmosphere at a pressure of 100 atmospheres at 800° C. to 250 atmospheres at 650° C. The oxidation requires a few hours, namely 2 to 10 hours.

The result of said oxidation is shown in FIG. 8 where the visible parts of the insulating zone are referenced 671 to 674, while the reference numerals 5411, 5412 and 542 denote the channel stopping regions of the implanted zone 54 whose thickness is 0.6 $\mu$m or less and the resistance is 4000 Ohms per square or more.

The insulating zones 672 and 674 ensure the insulation between the remainder of the integrated circuit and the region 482 in which the transistor is to be formed, while the insulating zone 673 divides the said region into two parts, namely the collector connection region which is formed in the part 4821 and the base and emitter zones which are formed in the other part 4822.

The insulating zones 671 and 672 insulate the region 481 in which a resistor of low ohmic value is to be formed by the same implantation which is used for the formation of the collector zone, and the contacts with the region 481 can be improved by implanted zones which are formed simultaneously with the emitter zone.

A true replica of the basic mask is then formed in the layer 57 via etching of the parts of said layer 57 which are left exposed through the apertures of the basic mask. Orthophosphoric acid is used, for example, for the etching treatment.

In this stage of the manufacture it is possible to remove the remaining parts of the basic mask 58. This is carried out by etching with ammonium fluoride and glacial acetic acid. The disk obtained in this phase is shown in FIG. 9.

A layer of photosensitive lacquer 69 is then provided on the said plate in which an aperture is provided which separates the parts 691, 692 from each other.

Via a chemical etching treatment the region 574 of silicon nitride is removed, and then the region 564 of silicon oxide is removed so that the part 551 of the surface 55 of the epitaxial layer is exposed. The disk obtained in this stage is shown in FIG. 10.

The photolacquer regions 691 and 692 are then removed. As a masking against an ion implantation with an ion dose of $10^{15}$ to $5.10^{15}$ phosphor ions per cm$^2$ and an energy of 40 KeV to 100 KeV to obtain implanted zones which are to form the collector connection region, the resistor of low ohmic value, and the contacts of said resistor, a fresh layer of photosensitive lacquer 71 of which the parts 711, 712, 713 in the plane of the figure are separated form each other by the aperatures 721, 722, is then provided on the same active surface of the disk.

By a fresh ion implantation are formed the collector connection regions 73 in the regions 4821, the implanted zone 74 which in the region 481 forms the body of the resistor of low ohmic values, and the implanted zones 751 and 752, the latter forming the contacts of the said resistor. The disk obtained in this stage is shown in FIG. 11.

The photolacquer layer 71 is removed entirely while as a masking against the implantations to form the emitter zone, the other shallow n-type regions and the n-type contact zones, a photolacquer layer 76 is provided on the active surface of the plate whose parts 761, 762, 763, in the plane of the figure, are separated from each other by the apertures 771 and 772.

By means of known etching treatments, the exposed parts of the silicon oxide layer 56 are removed so that the apertures 781, 782 and 783 are obtained.

The etching bath slightly attacks the silicon oxide of the insulating zones, but this is of no significance in view of the small thickness of the layer 56 with respect to the insulating zones.

By an ion implantation with an ion dose of $8.10^{14}$ to $7.10^{15}$ arsenic ions/cm$^2$ and an energy of 80 KeV to 140 KeV via the apertures 781, 782, 783 and 772, the surface contact zones 791 and 792 of the resistor, a surface contact zone 793 of the collector electrode, and an emitter zone 79 are formed, the dimensions and the position of said emitter zone being determined by the aperture 783 which is a true replica of an aperture of the basic mask. The disk obtained in this stage is shown in FIG.12.

Figure 13:
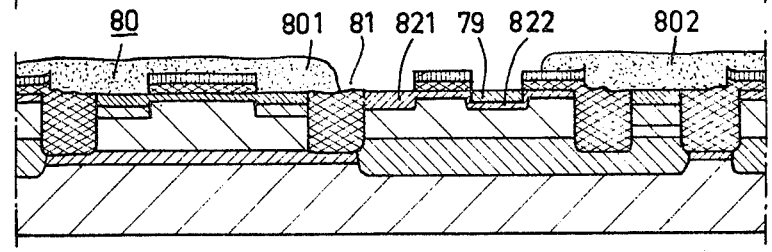

After removing the photolacquer layer 76, there is provided on the same active surface of the disk a fresh photosensitive lacquer layer 80 whose parts 801, 802 leave an aperture 81 via which the exposed part of the layer 56 which corresponds to the place occupied by the base contact zone is removed. Via the said aperture 81 a base contact zone 821 and an intrinsic base zone 822 are formed by an ion implantation with a dose of $5,10^{13}$ and $5.10^{14}$ boron ions/cm$^2$ and an energy of 30 KeV to 50 KeV, the latter base zone 822 being obtained by implantation through the implanted emitter zone 79. The disk obtained in this stage is shown in FIG. 13.

The photolacquer layer 80 is then removed and a thermal treatment is carried out to redistribute the implanted impurities. Said annealing treatment is carried out, for example, in an oxygen atmosphere at a temperature of 975° C. to 1050° C. for 30 minutes. The various zones of the device, in particular the base zone and the emitter zone of the transistor, are to obtain the desired ultimate optimum thickness and concentration by the said annealing treatment. The manufacture of the device by means of the method according to the invention is terminated by forming the required connectoins, usually formed by an aluminum conductor pattern. This may be carried out by means of any known method.

In the present example, after the formation of the various regions and the insulating zones of the device, the whole surface of the plate is covered with an insulating layer 83 of silicon oxide in a thickness of approximately 0.7 μm provided by pyrolytic deposition from a silane atmosphere.

Figure 14:
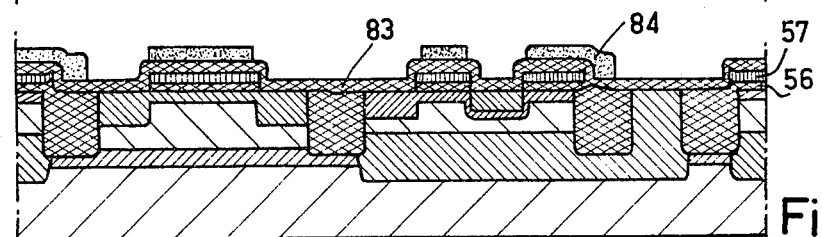

The insulating layer 83 is covered with a layer of photosensitive lacquer 84 is which a mask is formed by photopolymerization the apertures of which correspond approximately to the pattern of metal conductors which are to form a first connection level. The disk obtained in this stage is shown in FIG. 14.

The photolacquer layer 84 is used as a mask for etching the insulating zone 83. Since the insulation at the surface of the disk is ensured by what remains from the layers 56 and 57 and by the insulating zones, the precision with which the photoetching treatment of the insulating zone 83 is carried out need not be very great.

The provided oxide layer 83 is etched via the apertures of the mask 84 by means of known solutions of hydrofluoric acid and ammonium fluoride, the said etching process being continued until the exposure of the silicon surface so as to realize in this manner a good contact between the silicon and the metal provided afterwards. The apertures provided in the zone 83 in this manner form the contact apertures of the various regions of the device.

Figure 15:
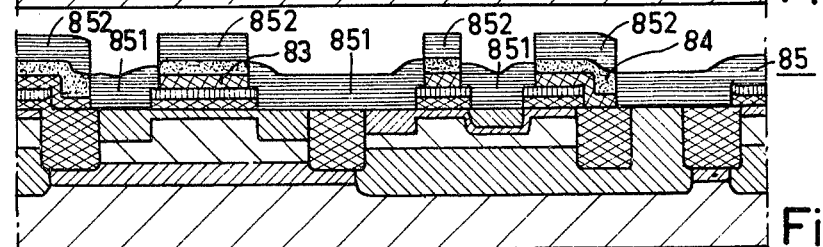

Without removing the remainder of the photolacquer layer 84, a thin layer of aluminum 85 is then provided over the whole surface of the disk by vapor deposition in a vacuum, the thickness of the said layer 85 preferably being approximately equal to the thickness of the layer 83 increased by the thicknesses of the layers of protective material locally remaining at the surface of the disk. As a result of the difference in level between the exposed silicon surface and the upper surface of the lacquer layer 84, the thin aluminum layer 85 is divided into two parts at different levels, namely a part 851 which is present on the silicon, and a part 852 which is situated on the lacquer layer 84. The disk obtained in this stage is shown in FIG. 15.

Figure 16:
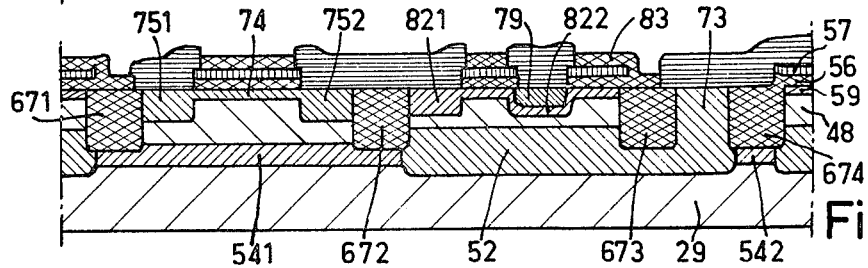

By removing the remainder of the photolacquer layer 84, the aluminum part 852 is then removed and in this manner a first metallization layer is obtained. The plate obtained in this stage is shown in FIG. 16.

It is to be noted that the layer 56 of which a large part remains unattacked until the end of the manufacture of the device improves the surface state and avoids the occurrence of electrical charges at the interface between the silicon nitride and the silicon. The said layer 56 also serves as a barrier layer upon etching the first insulating layer. In addition, said layer 56 reduces the crystal damages to which the incidence of an ion beam on a solid gives rise, and said layer 56 absorbs a part of the implanted ions, so that the maximum concentration of the implanted zone 59 coincides with the surface of the silicon.

The description does not give any explanation for the realization of further metallization levels, but it will be apparent that the abovedescribed method which permits obtaining a device having a first metallization level can also be used to obtain a device having several metallization levels. For example, it is possible to provide on a device as shown in FIG. 16 a fresh insulating layer and then a photolacquer layer which is subjected to a photopolymerization, then to etch the said zone, to provide the aluminum and to remove the remaining photolacquer, the series of treatments which correspond to the first connection level being repeated. In this manner it is possible first to provide a layer which is destined to form the connections between the first and the second metallization levels and then to form a second metallization level.

It can be established that the basic mask and the replica thereof which are used in the method according to the invention permit defining with the greatest possible precision the positions and the dimensions of the insulating zones, of the regions and of the contact apertures of a device. Small tolerances which permit minimum dimensions are obtained when the process is started from a single photoetching process of the basic mask, while all the position and dimension definitions are obtained during the further progress of the method from the definition provided by the basic mask without this requiring a new alignment step and without the alignment of the successive processes having to be carried out in the same precise manner as for the basic mask itself. It should be noted in particular that the self aligning provision of the insulating zones permits space saving: for example, the distance between the base zone and the collector connection region 73 (FIG. 16) of the device for which the manufacture was described above, is equal to the width of the insulating zone 673 and smaller than 6 μm at the level where the width is maximum, while in the most favorable case to obtain a breakdown voltage of 20 V the use of conventional known methods would have required a distance of approximately 8 μm in an epitaxially grown material of which the resistivity is 1 Ohm.cm.

According to the example which is described with reference to FIGS. 17 to 25, the starting material is a flat disk which is formed by a low doped p-type silicon substrate 30; said substrate 30 is covered with an arsenic-doped n-type epitaxial layer 31 in which, prior to providing the layer 31, strongly doped buried n-type regions 302, 303 were formed, as well as a thin channel stopping p-type layer 32 which is provided by a boron implantation. The buried regions 302, 35 are to eliminate a parasitic pnp-transistor.

On the exposed surface of the epitaxial layer 31 a layer 33 of silicon oxide is formed, after which boron ions are implanted via said layer 33 so that the implanted p-type region 34 is obtained. A first insulating layer 35 of silicon nitride is then provided succeeded by a second insulating layer 36 of aluminium oxide.

Figure 17:
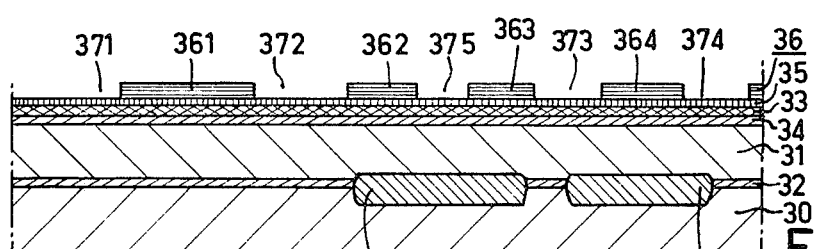
FIGS. 17 to 25 are partly diagrammatic cross-sectional views of various stages in the manufacture of a disk having an integrated semiconductor circuit comprising at least an n-type channel field effect transistor, a p-type channel field effect transistor and a resistor.

By photoetching, the apertures 372 to 375 are formed in the layer 36 to form the basic mask. The disk obtained in this stage is shown in FIG. 17.

Figure 18:
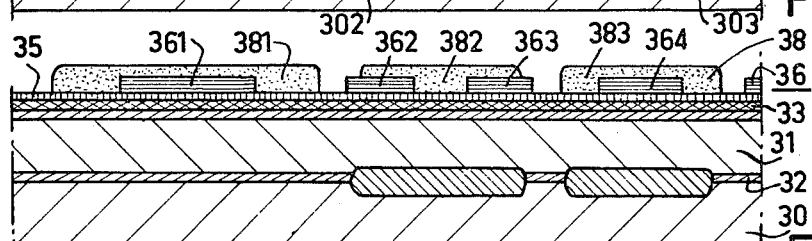

A photolacquer mask 38 of which the parts 381, 382 and 383 expose the places for providing the insulating zones is provided on the disk. The disk obtained in this stage is shown in FIG. 18.

It is to be noted that the mask 38 does not require the same precision as the basic mask 36. The part 382 may without any objection be shifted with respect to the edges of the parts 362 and 363. The edges of the parts 381 and 383 need not be provided with the same great precision as is required for a base electrode, an emitter electrode, a resistor or a control electrode of a field effect transistor; the precision required for the last-mentioned parts remains ensured and determined by the basic mask.

The parts of the layer 35 which are not protected by the mask 38 or by the mask 36 are then removed by means of orthophosphoric acid. The etching process is terminated automatically on the layer 33 of silicon oxide and the mask 38 is then removed.

Figure 19:
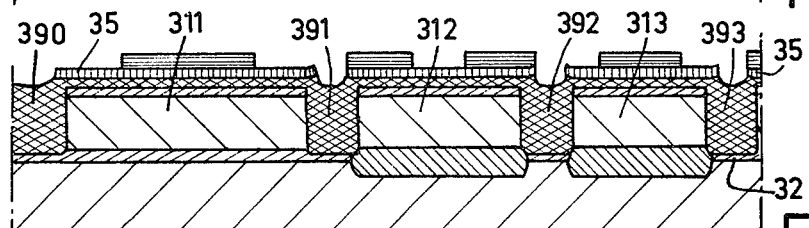

Etching is continued with a solution of hydrofluoric acid as a result of which apertures are formed in the layer 33 which are a true replica of the apertures which are provided in the layer 35. By the use of a suitable etchant the grooves for the insulating zones are then provided in the silicon layer 31, which grooves are then filled by an oxidation at comparatively low temperatures, for example, at high water vapor pressure. In this manner the insulating zones 390 to 393 are obtained which as regards their depth extend down to the layer 32 and divide the epitaxial layer 31 into mutually insulated island-shaped parts 311, 312, 313; the components of the circuit will be formed in said parts. The disk obtained in this stage is shown in FIG. 19.

Figure 20:
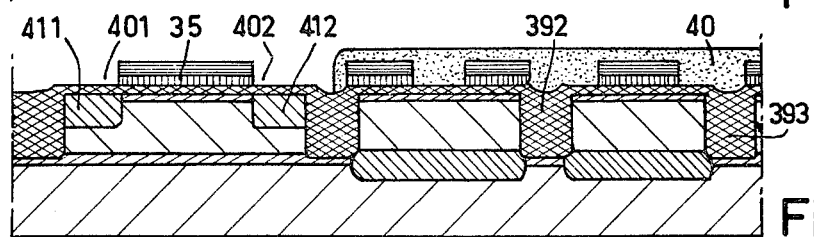

A true replica of the basic mask 36 is then formed in the layer 35 via etching of the silicon nitride parts exposed through said mask 36 by means of orthophosphoric acid. A photolacquer layer 40 in which apertures 401, 402 are provided at the area of the source and drain electrodes of the n-channel field effect transistor is then provided on the disk. Said source region 411 and said drain region 412 are formed by an implantation of phosphorus ions via the apertures 401, 402, simultaneously with the formation, if any, of the collector contact region of bipolar transistors. The disk obtained in this stage is shown in FIG. 20.

Figure 21:
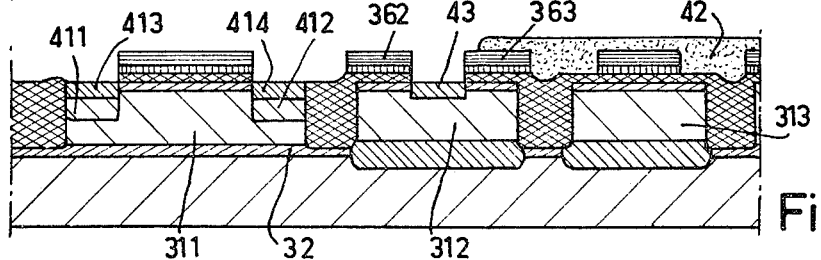

By means of a fresh photolacquer mask 42 which is provided on the surface of the disk after removing the mask 40, the exposed parts of the silicon oxide layer 33 are removed after which, via the apertures formed in the said layer 33 in this manner, a region 43 is formed by an arsenic ion implantation which forms the control electrode of a p-channel field effect transistor, of which control electrode the dimensions are determined by the aperture 375 of the basic mask, while simultaneously arsenic is implanted in the surface parts 413 and 414 of the regions 411 and 412. The said implantation may also form the emitters of the bipolar transistors of the same circuit. The disk obtained in this stage is shown in FIG. 21.

Figure 22:
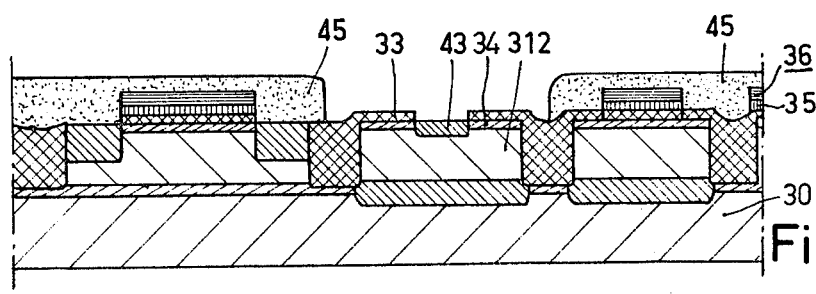

After removing the photolacquer mask 42, a fresh photolacquer mask 45 is provided on the surface of the disk and the exposed parts 362, 363 of the basic mask 36 are removed via the apertures of said mask and then the exposed parts of the identical mask 35, said parts corresponding to the place of the source and drain electrodes of the p-channel field effect transistor. The disk shown in this stage is shown in FIG. 22.

Figure 23:
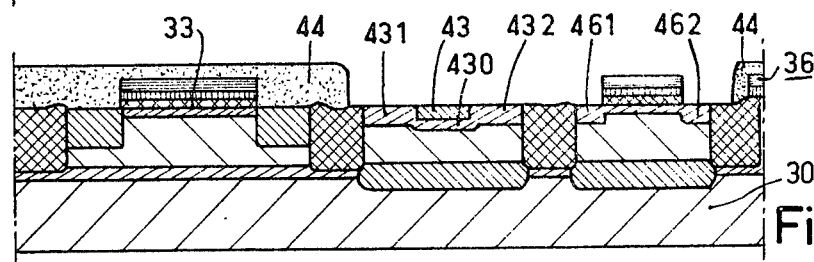

After removing the photolacquer mask 45, a fresh photolacquer mask 44 is formed on the surface of the disk, via the apertures of which the parts of the silicon oxide layer 30 are etched which correspond to the place of the source and drain regions of the p-channel field effect transistor and to the contact zones of the resistor. Via the apertures provided in this manner and also via the region 43 which was entirely exposed, a boron ion implantation is then carried out and the source region 431, the drain region 432 and the channel 430 of the p-channel field effect transistor are formed, as well as the contact zones 461 and 462 of the resistor. The disk obtained in this stage is shown in FIG. 23.

The mask 44 may then be removed and then also the remainder of the basic mask 36; a thermal treatment is then carried out to redistribute the implanted dopants.

Figure 24:
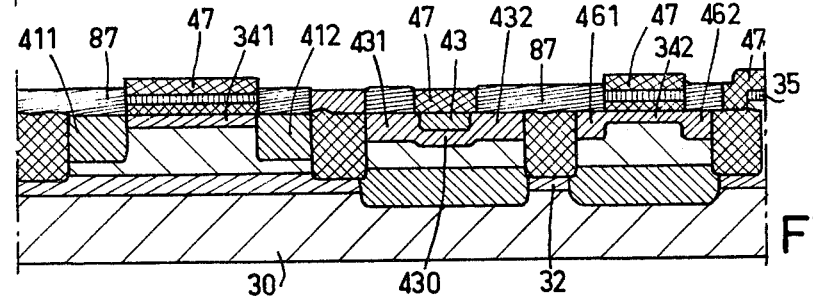

The manufacture of the device with the method according to the invention is terminated by the formation of the required connections. By a method which is analogous to the method which was described with reference to FIGS. 14, 15 and 16, the disk is covered with an insulating layer of silicon oxide 47, then with a layer of photosensitive lacquer in which a mask is formed whose apertures correspond approximately to the pattern of the metal conductors of a first metallization level. The said layer 47 is etched and a thin layer of aluminum 87 is provided of which the unnecessary parts are removed by removing the lacquer mask (FIG. 24).

A silicon nitride layer 88 and then a silicon oxide layer 89 are provided on which again a lacquer mask is formed and, after etching the layers 88 and 89, providing the thin layer of aluminum and removing the lacquer mask, an aluminum layer 90 is obtained which forms the zones which are destined for the interconnection between two metallization levels which are sometimes referred to as "vias".

Figure 25:
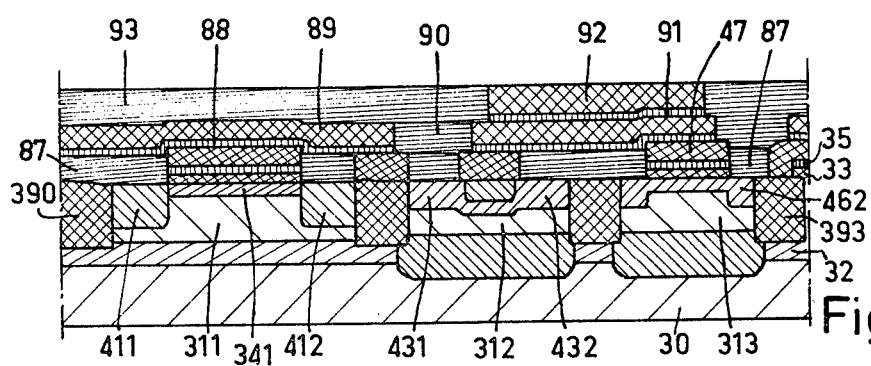

By using a fresh layer of silicon nitride 91 and a fresh layer of silicon oxide 92, a second metallization level of aluminum conductors 93 can be formed (FIG. 25).

With suitable thicknesses of the various silicon nitride layers, silicon oxide layers and aluminum layers, metallization levels are obtained in which the level differences are minimum.

It is to be noted that the method which was described with reference to FIGS. 1 to 16 may also be applied to the manufacture of a device having field effect transistors and resistors which belongs to the type which is realized by using the method which was described with reference to FIGS. 17 to 25 and that conversely said latter method may also be used for the manufacture of a device having bipolar transistors and resistors described with reference to FIGS. 1 to 16. By using the method according to the invention, circuits may also be obtained with components such as diodes and capacitances.

What is claimed is:

1. A method of manufacturing a semiconductor integrated circuit having at least one semiconductor circuit element, which comprises:
   providing a semiconductor body comprising an epitaxial layer of a first conductivity type on a substrate of a second conductivity type opposite to that of the first;
   providing a third insulating layer directly on the semiconductor body surface;
   providing a first insulating layer of a material other than that of said third layer and comprising silicon nitride on said third insulating layer;
   providing a substantially planar and uniform second insulating layer of a material other than that of said first and said third layers on said first insulating layer;
   simultaneously providing apertures in said substantially planar and uniform second layer at a plurality of areas where surface-adjoining zones of said semiconductor circuit element are to be formed; including at least one aperture surrounding a semiconductor island in which said semiconductor circuit element is to be provided, to form a basic mask which will simultaneously and precisely define the dimensions and locations of all dimensionally-critical regions of the circuit element to be formed; then covering all but at least a part of said one surrounding aperture with a covering layer; then selectively removing said first insulating layer within the uncovered region; then selectively removing said third insulating layer within at least said part of said one aperture; then removing said covering layer; then selectively etching recesses in the uncovered semiconductor material in said one aperture; then thermally oxidizing the uncovered semiconductor material in said one aperture to selectively form a recessed oxide insulating zone extending down to said substrate and surrounding said island; then selectively removing the first insulating layer within all remaining apertures of the basic mask in the second insulating layer to form a replica of said remaining aperture in said first insulating layer without removing the underlying third insulating layer; and then selectively forming said surface-adjoining semiconductor zone of said semiconductor circuit element in at least one of said remaining apertures by ion implantation through said third insulating layer.

2. A method as claimed in claim 1, characterized in that in a first operation the first insulating layer is removed only in a part of the first aperture in the second insulating layer and that after the thermal oxidation the first insulating layer is removed also within the remaining part of the first aperture in the second insulating layer and a doped semiconductor zone adjusting the insulating zone is formed via said remaining part.

3. A method as claimed in claim 1, characterized in that the third insulating layer is provided of silicon oxide.

4. A method as claimed in claim 1, characterized in that the second insulating layer is provided of aluminum oxide.

* * * * *

UNITED STATES PATENT AND TRADEMARK OFFICE
CERTIFICATE OF CORRECTION

PATENT NO. : 4,443,933
DATED : April 24, 1984
INVENTOR(S) : MICHEL X.M. DE BREBISSON It is certified that error appears in the above-identified patent and that said Letters Patent is hereby corrected as shown below:

Claim 2, line 7, change "adjusting" to --adjoining--

Signed and Sealed this

Twenty-seventh Day of November 1984

[SEAL]

Attest:

GERALD J. MOSSINGHOFF

Attesting Officer          Commissioner of Patents and Trademarks

UNITED STATES PATENT AND TRADEMARK OFFICE
CERTIFICATE OF CORRECTION

PATENT NO. : 4,443,933

DATED : April 24, 1984

INVENTOR(S) : MICHEL X.M. DE BREBISSON

It is certified that error appears in the above-identified patent and that said Letters Patent is hereby corrected as shown below:

In the Claims:

Claim 1, line 34, change "then" to --and--

Signed and Sealed this

Fourteenth Day of May 1985

[SEAL]

Attest:

DONALD J. QUIGG

Attesting Officer     Acting Commissioner of Patents and Trademarks